United States Patent
Hopkins

(10) Patent No.: US 6,208,174 B1
(45) Date of Patent: Mar. 27, 2001

(54) HIGH-SPEED COMPARATOR SYSTEMS AND METHODS WITH ENHANCED NOISE REJECTION

(75) Inventor: Michael Clarence Hopkins, Mebane, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/461,516

(22) Filed: Dec. 14, 1999

(51) Int. Cl.[7] .................................................. H03K 5/22
(52) U.S. Cl. ........................................ 327/65; 327/66
(58) Field of Search .......................... 327/52, 53, 54, 327/56, 60, 63, 65, 66, 67, 69, 70, 72, 78, 79, 81, 82, 85, 89, 90

(56) References Cited

U.S. PATENT DOCUMENTS

| 5,081,369 | * | 1/1992 | Tsuzuki et al. | 327/65 |
|---|---|---|---|---|
| 5,387,829 | * | 2/1995 | Wu et al. | 327/67 |
| 5,517,148 | * | 5/1996 | Yin | 327/333 |
| 5,621,340 | * | 4/1997 | Lee et al. | 327/77 |
| 5,648,735 | * | 7/1997 | Bowers et al. | 327/65 |
| 5,834,951 | | 11/1998 | Klein | 327/53 |
| 6,081,162 | * | 6/2000 | Johnson | 330/301 |

* cited by examiner

*Primary Examiner*—My-Trang Nuton
(74) *Attorney, Agent, or Firm*—Koppel & Jacobs

(57) ABSTRACT

Comparator systems and methods are provided that isolate their input and output processes from each other. Comparator signals are converted to a differential current in an input process and are carried via the differential current to an output process which converts the differential current to a comparator output signal. Supply rails that are coupled to the input process are isolated from the output process and supply rails that are coupled to the output process are isolated from the input process. The differential-current transmission and supply rail isolation effectively reduce feedback and, in addition, the differential current enhances common-mode signal rejection.

22 Claims, 6 Drawing Sheets

HIGH-SPEED COMPARATOR SYSTEMS AND METHODS WITH ENHANCED NOISE REJECTION

BACKGROUND OF THE INVENTION

1. Field of the Invention

The present invention relates generally to comparators.

2. Description of the Related Art

FIG. 1A illustrates a conventional comparator system 20 that includes a comparator 22 which receives differential signals from an input port 23. The system also includes first and second inverters 24 and 26 that couple the differential output of the comparator 22 to a differential output port 28. Supply rail structures 30 and 32 provide bias voltages in common to the comparator 22 and inverters 24 and 26.

Various inductance sources (e.g., package, wire bonds, metal interconnects) and capacitance sources (e.g., device diffusion capacitances, interconnect-to-substrate capacitances) form parasitic inductances 34 and capacitances 36 that are positioned respectively in and across the rail structures 30 and 32. In order to reduce jitter, the comparator 22 is generally designed to exhibit a first switching threshold when its differential input signal is moving in a first relative direction and a second, different switching threshold when it is moving in a second relative direction (i.e., the comparator is designed to exhibit a predetermined hysteresis).

FIG. 1B illustrates a small-signal model of an exemplary CMOS transistor 40 that can be used in a realization of the comparator system 20 of FIG. 1A. This model shows a current source 42 which generates a current 43 of magnitude $g_m v_{gs}$ between a source 46 and a drain 44 in which $v_{gs}$ is the voltage between a gate 48 and the source and gm represents the transistor's small-signal transconductance. The transistor's structure (e.g., its gate structure) causes it to exhibit a gate-to-source capacitance 52 and a gate-to-drain capacitance 50.

In a typical operation of the comparator system 20, the comparator 22 compares a differential analog signal that is applied to the input port 23 and, in response, generates a binary signal whose state corresponds to the polarity of the differential signal. The high-gain inverters 24 and 26 amplify this signal to a desired logic level (e.g., a complementary metal-oxide semiconductor (CMOS) level) which is provided at the output port 28.

The amplification process in the inverters 24 and 26 of FIG. 1A generates current impulses in the supply rail structures 30 and 32. These impulses typically react with the parasitic elements (inductances 34 and capacitances 36) to form spurious signals that are coupled back (e.g., along feedback paths 54) to the input of the comparator 22. The feedback signals are typically broadband in nature and high enough in frequency to initiate spurious conduction through current sources (42 in FIG. 1B) and capacitances (50 and 52 in FIG. 1B) of the comparator's transistors.

In addition, low-frequency components of the feedback signals alter (e.g., due to backgate effects) threshold voltages in the comparator's transistors which, in turn, alter the predetermined hysteresis of the comparator 22. Because the comparator system 20 lacks adequate noise rejection, the initiated spurious conduction and altered hysteresis effects become major noise sources of jitter, and consequent error, in the comparator system 20.

SUMMARY OF THE INVENTION

The present invention is directed to comparator systems and methods that enhance noise rejection by isolating their input and output processes from each other. Signal feedback between output and input is thus reduced and this reduction inhibits generation of spurious signals and stabilizes predetermined hysteresis settings to thereby enhance comparator accuracy and speed.

In an input process of the invention, a comparator signal is converted to a differential current. The comparator signal is then carried via the differential current to an output process which converts the differential current to a comparator output signal. Supply rails that are coupled to the input process are isolated from the output process and supply rails that are coupled to the output process are isolated from the input process. The differential-current transmission and supply rail isolation effectively reduce feedback and, in addition, the differential current enhances common-mode signal rejection.

The novel features of the invention are set forth with particularity in the appended claims. The invention will be best understood from the following description of embodiments when read in conjunction with the accompanying drawings.

DETAILED DESCRIPTION OF THE EMBODIMENTS

Figure 2:
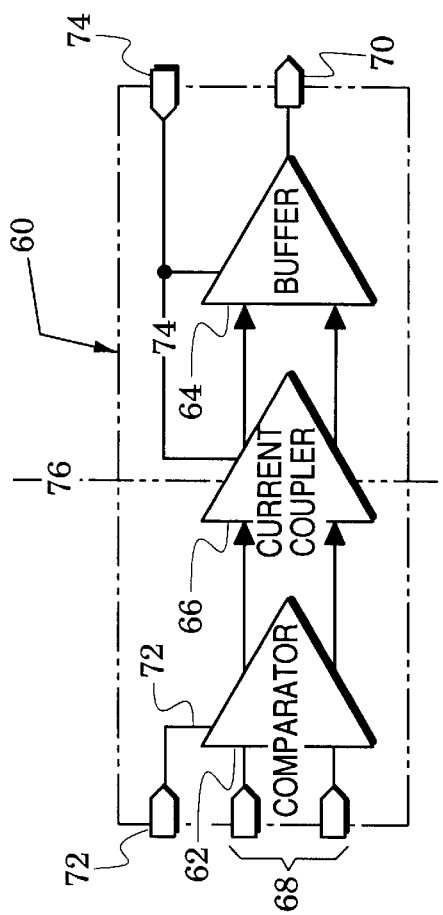
FIGS. 2 and 3 are block diagrams of comparator system embodiments of the present invention.

FIG. 2 illustrates a comparator system embodiment 60 which has enhanced noise rejection and, accordingly, is able to reduce decision errors that are typically found in conventional comparators.

In particular, the comparator system 60 has a comparator 62, a buffer 64 and a current coupler 66 that couples signals between the comparator and the buffer. The comparator 62 receives differential signals from a differential input port 68 and the buffer delivers an output signal at an output port 70. A first supply rail structure 72 is isolated from the current coupler 66 and the buffer 64 and is coupled to deliver a supply voltage to the comparator 62. A second supply rail structure 74 is isolated from the comparator 62 and is coupled to deliver a supply voltage to the current coupler 66 and, preferably, to the buffer 64.

The current coupler 66 provides current signals which communicate the binary decisions of the comparator 62 to the buffer 64. In addition, the first and second rail structures 72 and 74 are isolated from one another. Accordingly, the comparator system 60 isolates output processes of its buffer 64 from the input processes of its comparator 62. This process isolation effectively severs conductive feedback paths (e.g., the feedback paths 54 in FIG. 1A) between the buffer 64 and the comparator 62 and is symbolized by a broken process partition line 76 that is positioned through the current coupler 66.

Because differential current signals inherently provide substantial noise rejection and common-mode signal rejection and because its rail structure feedback paths are severed, the comparator system 60 has enhanced noise-rejection capability. Typically, the comparator 62 is configured to have a hysteresis that is predetermined to reduce indecision when the comparator is presented with noisy input signals. Because of the enhanced noise rejection of the comparator system 60, this predetermined hysteresis is substantially unaffected by feedback signals and continues to effectively reduce comparator errors.

Figure 3:
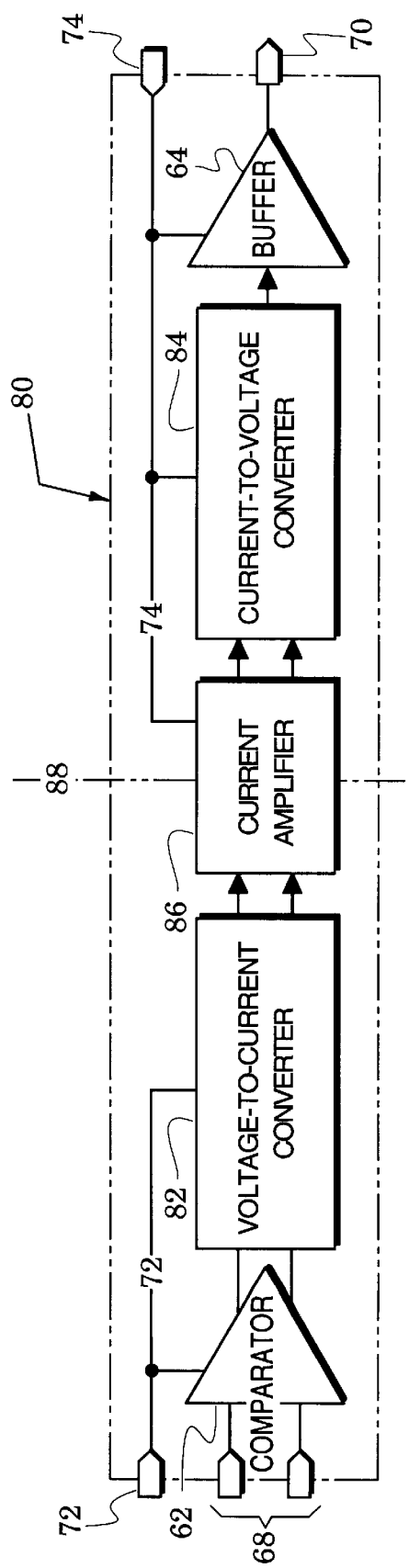

FIG. 3 illustrates another comparator system embodiment 80 which is similar to the comparator system 60 with like elements indicated by like reference numbers. In contrast, however, the system 80 realizes the current coupler 66 of FIG. 2 with a voltage-to-current converter 82, a current-to-voltage converter 84 and a current amplifier 86 that couples these converters together.

In system operation, the voltage-to-current converter 82 converts the differential decisions at the output of the comparator 62 to differential currents which are amplified into amplified differential currents by the current amplifier 86. The amplified differential currents are then converted into differential voltage signals that are provided to the buffer 64 by the current-to-voltage converter 84. The differential amplification of the current amplifier 86 permits current amplitudes to be reduced in the voltage-to-current converter 82 with a consequent enhancement of the converter's speed.

Input and output processes are substantially isolated from each other in the comparator system 80 by the isolation of input and output rail structures 72 and 74 and by the inherent isolation of current transmission through the current amplifier. Accordingly, this isolation and its resultant noise rejection are symbolized by a broken process partition line 88 that is positioned through the current amplifier 86.

Figure 4:
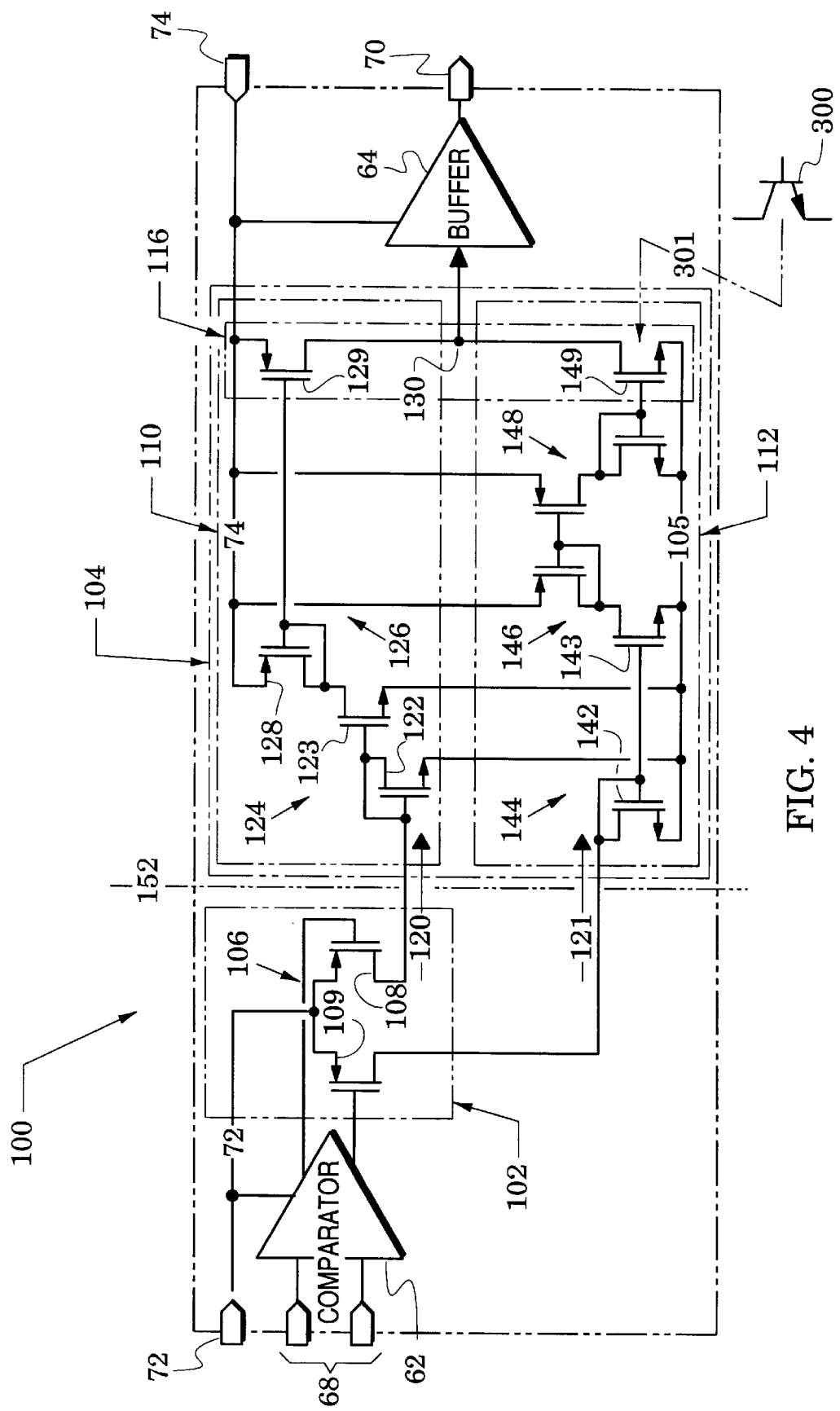
FIGS. 4 and 5 are schematics of other comparator system embodiments.

FIG. 4 shows another comparator system embodiment 100 that is similar to FIG. 3 with like elements indicated by like reference numbers. The comparator system 100, however, has a voltage-to-current converter 102 which is responsive to the output of the comparator 62 and a current mirror structure 104 which delivers an output signal to the buffer 64 in response to the voltage-to-current converter 102.

In detail, the voltage-to-current converter 102 is formed by a differential pair 106 of transistors 108 and 109 whose sources are coupled to the supply rail 72, whose gates are differentially coupled to the output of the comparator 62 and whose drains are differentially coupled to the current mirror structure 104. This latter structure 104 is coupled between supply rail structures 74 and 105 and forms first and second current mirrors 110 and 112 which respectively include transistors 129 and 149 that are arranged as a complementary common-source output stage 116.

In response to the output of the comparator 62, the differential pair 106 generates differential currents 120 and 121 in the drains of transistors 108 and 109. The current 120 is received in the current mirror 110 by a diode-coupled transistor 122 which mirrors it to mirror transistor 123. Together, these transistors form an initial current mirror 124. A subsequent current mirror 126 is structured similarly to the first current mirror. It is arranged so that a diode-coupled transistor 128 receives current from the initial current mirror and mirrors it to a mirror transistor 129 whose current flows to an output node 130 of the current mirror structure 104.

The current 121 is received in the current mirror 112 by diode-coupled transistor 142 which mirrors it to mirror transistor 143. Together, these transistors form an initial current mirror 144. Subsequent current mirrors 146 and 148 are structured similarly to the initial current mirror. They are arranged so that the current mirror 146 receives current from the initial current mirror 144 and mirrors current to the last current mirror 148. This latter current mirror includes a mirror transistor 149 which mirrors current to the output node 130.

The first and second current mirrors 110 and 112 are arranged so that the mirror transistors 129 and 149 form a complementary common-source stage 116. Accordingly, differential currents of the complementary transistors 129 and 149 are converted to a voltage signal at the circuit node 130 and delivered to the buffer 64.

As in the comparator system 80 of FIG. 3, input and output processes are substantially isolated from each other in the comparator system 100 by the isolation of input and output rail structures 72 and 74 and by the inherent isolation of differential current transmission through the current mirrors 110 and 112. It is noted that the lower rail structure 105 is provided for the current mirror structure 104 and is isolated away from the comparator 62 and the voltage-to-current converter 102. This isolation is symbolized by a broken process partition line 152 that is positioned between the voltage-to-current converter 102 and the current mirror structure 104

Transistors in the current mirrors 110 and 112 can be sized to realize various current amplifications. For example, the mirror transistors 123 and 129 can be configured to have a 4:1 size relationship with their respective diode-coupled transistors 122 and 128. Accordingly, both the initial current mirror 124 and the subsequent current mirror 126 would then have a current gain of 4 and the first current mirror 110 have a gain of sixteen. Various other gains (e.g., a gain of one) can be realized in the current mirrors 110 and 112 by similar sizing relationships between mirror transistors and diode-coupled transistors.

Amplification of the current amplifier 68 facilitates a reduction of currents in the differential pair 106. This permits the transistors 108 and 109 to be smaller in size which, in turn, increases their speed. Thus, the voltage-to-current converter 102 can be configured so that it does not degrade the high-speed performance of the comparator 62.

Figure 5:
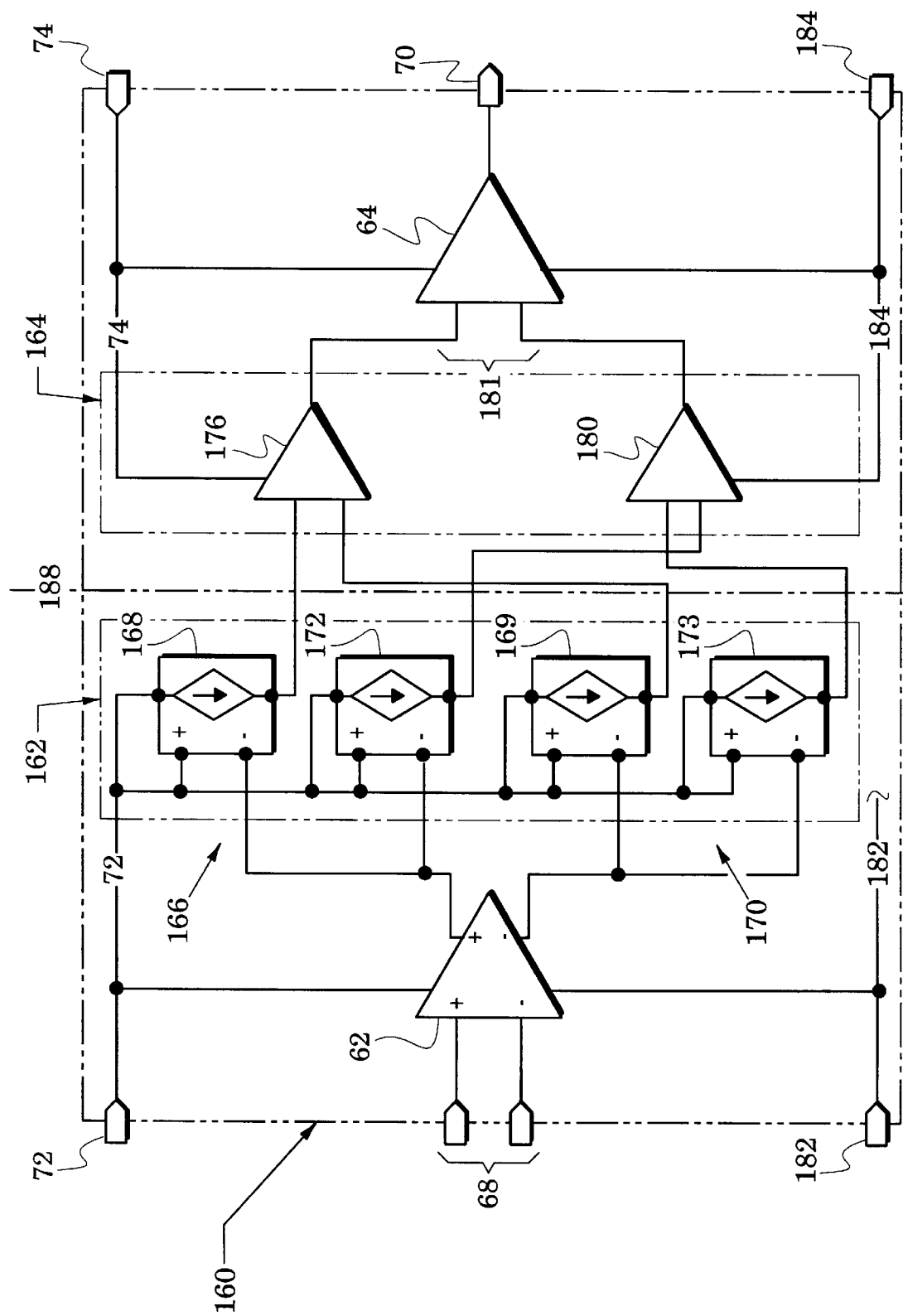

Another comparator system embodiment 160 is shown in FIG. 5. It is similar to FIG. 4 with like elements indicated by like reference numbers. The comparator system 160 has a differential stage 162 which is responsive to the differential output of the comparator 62 and a gain and output stage 164 which delivers an output signal to the buffer 64 in response to the differential stage.

Figures 1A, 1B:
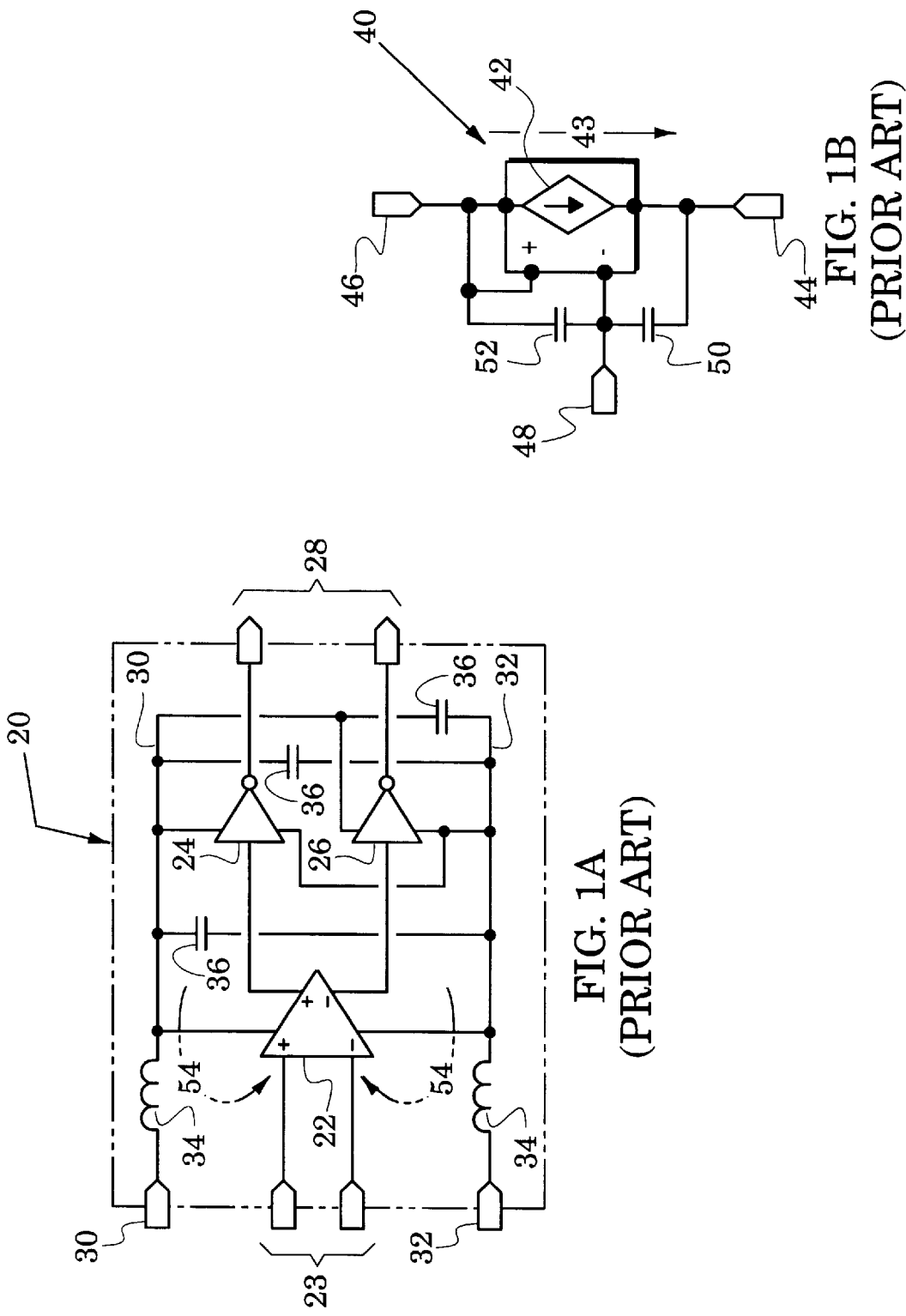
FIG. 1A is a schematic of a conventional comparator that includes parasitic inductances and capacitances.
FIG. 1B is a small-signal model of a CMOS transistor in the comparator of FIG. 1B.

In detail, the differential stage 162 is formed with a first differential pair 166 of transistors 168 and 169 and a second differential pair 170 of transistors 172 and 173 (the transistors are indicated with the small-signal model of FIG. 1B). In response to the comparator 62, the differential pair 166 generates differential currents that are received by a current amplifier 176 in the output stage 164. This current amplifier amplifies the received current so as to reduce currents in the differential pair. The current amplifier 176 also converts the amplified current to a voltage which is delivered to one of the inputs of a differential input 181 of the buffer 64.

In a similar response to the comparator 62, the differential pair 170 generates differential currents that are received by a current amplifier 180 in the output stage 164. This current amplifier also amplifies the received current so as to reduce currents in the differential pair and converts the amplified current to a voltage which is delivered to another of the inputs of the differential input 181. In response to the current amplifiers 176 and 180, the buffer then delivers a signal to the output port 70 that indicates the polarity of the differential signal at the input port 68.

The differential stage 162 and the gain and output stage 164 form a split-supply, low-gain, high slew-rate operational amplifier. In this amplifier, the comparator 62 and the differential stage 162 are powered via an upper rail structure 72 and a lower rail structure 182 which are both isolated from the gain and output stage 164 and the buffer 64. Similarly, the gain and output stage 164 and the buffer 64 are powered via an upper rail structure 74 and a lower rail structure 184 which are both isolated from the comparator 62 and the differential stage 162.

As in the other comparator system embodiments, the comparator 62 of the system 160 is preferably configured to have a predetermined hysteresis which reduces the comparator's indecision in the presence of noisy input signals at the input port 68. Input and output processes are substantially isolated from each other by the isolation of input rail structures 72 and 182 from the output rail structures 74 and 184 and by the inherent isolation of differential current transmission via the current amplifiers 176 and 180.

This isolation is enhanced by referencing the input voltage signals of the differential pairs 166 and 170 to the voltage rail 72 with which they were created in the comparator 62. Accordingly, the input-to-output isolation of the comparator 160 and its resultant noise rejection are symbolized by a broken process partition line 188 that is positioned between the differential stage 162 and the gain and output stage 164.

Figure 6:
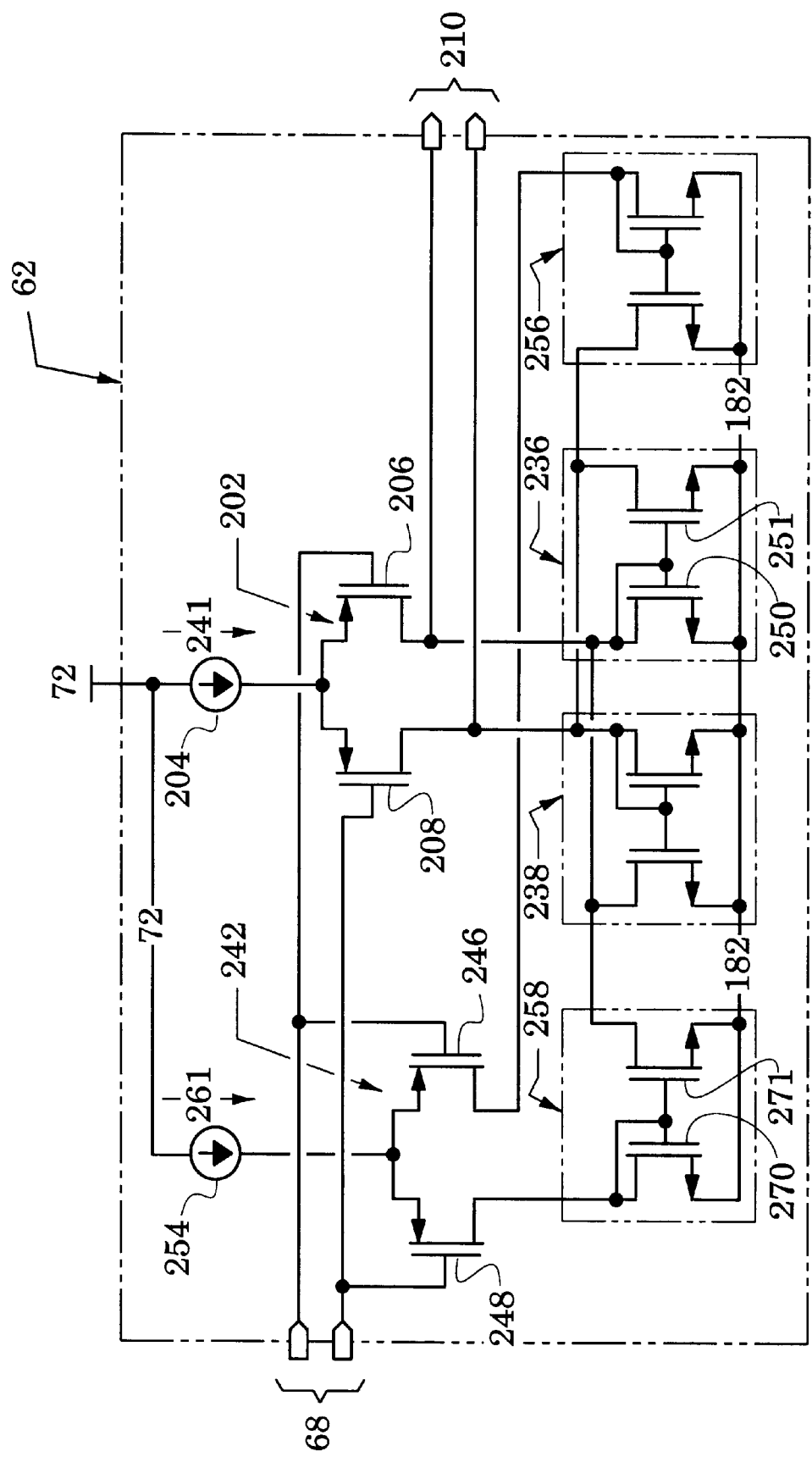
FIG. 6 is a schematic of a comparator embodiment in the comparator systems of FIGS. 2–5.

The comparator system embodiments of FIGS. 2-5 have been shown to include a comparator 62 and a buffer 64. An exemplary realization of the comparator 62 is illustrated in FIG. 6 where it is shown to include a first differential pair 202 of first and second transistors 206 and 208, a first current source 204, the input port 68 (also shown, for example, in FIG. 5), an output port 210, and first and second current mirrors 236 and 238. In the comparator system 160 of FIG. 5, the output port 210 is connected to the first and second differential pairs 166 and 170.

The comparator 62 further includes a second differential pair 242 of third and fourth transistors 246 and 248, a second current source 254 and third and fourth current mirrors 256 and 258 which form active loads for the third and fourth transistors. The third and fourth current mirrors 256 and 258 are cross-coupled between the first and second differential pairs 202 and 242 to provide high-speed independent discharge paths for the parasitic capacitance that is associated with the gates of the mirror transistors of the current mirrors 236 and 238 and the output port 210.

In particular, the first differential pair 202 is formed of transistors 206 and 208 that have control terminals (i.e., gates) and current terminals (i.e., drains) respectively coupled to the comparator input port 68 and the comparator output port 210. The first current source 204 is connected to the supply rail 72 (shown, for example, in FIG. 5) and is coupled to supply a current 241 to the sources of the first differential pair 202.

The first current mirror 236 includes a diode-coupled transistor 250 that is coupled between a supply rail 182 (also shown, for example, in FIG. 5) and the drain of transistor 206. It also includes a mirror transistor 251 whose gate and source are respectively coupled to the gate and source of diode-coupled transistor 250 and whose drain is coupled to the drain of the second transistor 208.

The arrangement of the first differential pair 202 and first current mirror 236 can be described more succinctly by stating that the first current mirror 236 is cross-coupled to current terminals of the first differential pair 202. Equivalently, it can be stated that diode-coupled transistor 250 of the first current mirror 236 responds to an excitation current from the first transistor 206 and mirror transistor 251 mirrors current to the second transistor 208 of the first differential pair. Using this simplified description, it is apparent from FIG. 6 that the second current mirror 238 is cross-coupled to respond to current from the drain of the second transistor 208 and mirror current to the drain of the first transistor 206.

The third and fourth transistors 246 and 248 of the second differential pair 242 have their control terminals coupled to the comparator input port 68 but their current terminals are free to generate independent discharge paths. A second current source 254 is connected to the supply rail 72 and is coupled to supply a current 261 to the sources of the second differential pair 242.

The third current mirror 256 is cross-coupled to respond to current from the drain of the third transistor 246 and mirror current to the drain of the second transistor 208 of the first differential pair 202. The fourth current mirror 258 is cross-coupled to respond to current from the drain of the fourth transistor 248 and mirror current to the drain of the first transistor 206 of the first differential pair 202. In particular, a diode-coupled transistor 270 of this latter current mirror receives a current from the fourth transistor 248 and a mirror transistor 271 mirrors a current to the first transistor 206.

The comparator of FIG. 6 provides a significantly enhanced operating frequency range and its parameter values can be adjusted to control comparator slew rates and hysteresis. FIG. 6 and its associated description may also be found in U.S. application Ser. No. 09/433,841 filed Nov. 4, 1999 in the name of Michael Clarence Hopkins and assigned to Analog Devices, Inc., the assignee of the present invention.

Figure 7:
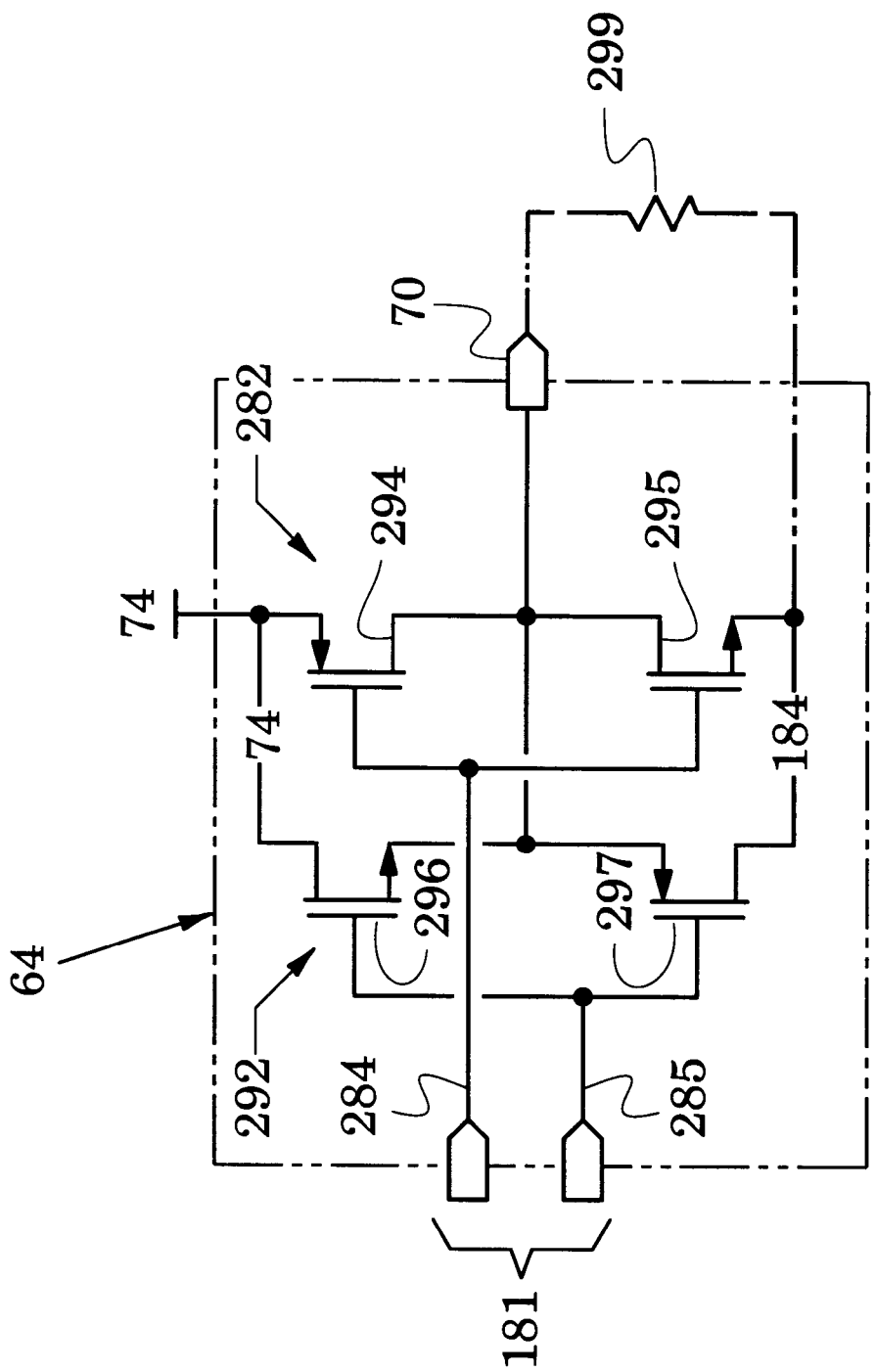
FIG. 7 is a schematic of an inverter embodiment in the comparator systems of FIGS. 2–5.

An exemplary realization of the buffer 64 is illustrated in FIG. 7 where its output is shown to include a complementary common-source stage 282 that is coupled between a first side 284 of the differential input 181 (also shown in FIG. 5) and the single-sided output port 70 (also shown in FIG. 5) and further includes a complementary common-drain stage 292 that is coupled between a second side 285 of the differential input 181 and the output port 70. The buffer of FIG. 7 acts as an inverter in which the state of the output port 70 is opposite the state of the first side 284 (and thus follows the state of the second side 285).

In particular, the complementary common-source stage 282 has first and second transistors 294 and 295 whose gates are coupled to the first side 284 and whose drains are coupled to the output port 70. The complementary common-drain stage 292 has third and fourth transistors 296 and 297 whose gates are coupled to the second side 285 and whose sources are coupled to the output port 70. The sources of the first and second transistors 294 and 295 are respectively coupled to the drains of the third and fourth transistors and are also respectively coupled to an upper supply rail 74 (also shown in FIG. 5) and to a lower supply rail 184 (also shown in FIG. 5).

In operation of the inverter 64, the complementary common-source stage 282 functions as an inverter and the complementary common-drain stage 292 functions as source followers that are driven with an inversion of the input signal applied to the complementary common-source stage 282. The source followers are particularly effective in adapting to and driving loads of various impedances.

Accordingly, this inverter structure has an enhanced ability to drive different inverter loads that are represented by an exemplary load 299. In particular, the inverter 64 can adapt to changing loads and thereby reduce the current-drive, gain and output-impedance variations of conventional inverters. Its structure also enhances inverter common-mode rejection (e.g., rejection of correlated noise).

Effectively, the inverter converts itself from a voltage driver for light loads (e.g., >200 ohms) to a current driver for heavy loads (e.g., <200 ohms). The inverter is inherently short circuit protected as it can drive loads of less than one ohm which can be referenced to either rail (i.e., the lower rail 184 or the upper rail 74).

FIG. 7 and its associated description may also be found in U.S. application Ser. No. 09/156,055 filed Dec. 7, 1999 in the name of Michael Clarence Hopkins and assigned to Analog Devices, Inc., the assignee of the present invention.

Transistor arrangements such as the output stage 116 of FIG. 4 and the stages 282 and 292 of FIG. 7 are generally referred to as complementary stages because they include devices of opposite polarity (e.g., an NMOS and a PMOS device) that are arranged to source and sink currents (i.e., they exhibit a push-pull capability). Stages 116 and 282 also often referred to as complementary common-source stages because each of the opposite-polarity devices has its source coupled in common with the stage's input and output circuits. In accordance with this nomenclature standard, transistor arrangements such as the stage 292 are generally referred to as complementary common-drain stages.

Although the systems of the invention have been described with reference to particular polarities of CMOS transistors, it is apparent that other embodiments can be formed by reversal of these polarities (e.g., by substituting NMOS devices for PMOS devices and vice versa) and that these embodiments are embraced by the following claims.

Systems of the invention are particularly suited for realization with CMOS transistors on a common substrate. In such realizations, it is customary to obtain isolation by coupling selected transistor leads to the common substrate. These isolation couplings have not been shown in the drawing figures as their implementation is well known and generally varies with each specific realization.

Although the invention has been illustrated with reference to CMOS transistors, the teachings of the invention can be practiced with any transistors that have current terminals which are responsive to control terminals. For example, bipolar junction transistors can be substituted as exemplified by bipolar junction transistor 300 and substitution arrow 301 in FIG. 4.

The preferred embodiments of the invention described herein are exemplary and numerous modifications, dimensional variations and rearrangements can be readily envisioned to achieve an equivalent result, all of which are intended to be embraced within the scope of the appended claims.

I claim:

1. An enhanced noise-rejection comparator system that generates an output signal whose state corresponds to the polarity of a differential input signal, comprising:

a comparator that generates a comparator signal in response to said differential input signal;

an output buffer that generates said output signal in response to a buffer input signal;

a current coupler that has first and second coupler portions wherein said first coupler portion generates a differential current that corresponds to said comparator signal and said second coupler portion generates said buffer input signal in response to said differential current;

a first supply rail structure that is coupled to deliver a first supply voltage to said first coupler portion and that is isolated from said second coupler portion; and a second supply rail structure that is coupled to deliver a second supply voltage to said second coupler portion and that is isolated from said first coupler portion.

2. The comparator system of claim 1, wherein said second coupler portion amplifies differential current to thereby reduce current magnitudes and enhance speed in said first coupler portion.

3. The comparator system of claim 1, wherein:

said first coupler portion is a voltage-to-current converter; and said second coupler portion includes a current-to-voltage converter and a current amplifier that couples said voltage-to-current converter and said current-to-voltage converter.

4. The comparator system of claim 3, wherein said current amplifier has a current gain of one.

5. The comparator system of claim 3, wherein said current amplifier has a current gain of sixteen.

6. The comparator system of claim 1, wherein:

said first coupler portion includes a differential pair of first and second transistors that generate said differential current in the form of first and second currents; and said second coupler portion includes first and second current mirrors that process said first and second currents into said buffer input signal.

7. The comparator system of claim 6, wherein said first and second current mirrors respectively terminate in first and second current-mirror transistors that are arranged to form a complementary stage that provides said buffer input signal.

8. The comparator system of claim 7, wherein at least one of said first and second transistors and said first and second current-mirror transistors is a metal-oxide semiconductor transistor.

9. The comparator system of claim 7, wherein at least one of said first and second transistors and said first and second current-mirror transistors is a bipolar transistor.

10. An enhanced noise-rejection comparator system that generates an output signal whose state corresponds to the polarity of a differential input signal, comprising:

a comparator that generates a comparator voltage in response to said differential input signal;

a voltage-to-current converter that converts said comparator voltage into a differential current;

a current amplifier that amplifies said differential current into an amplified differential current;

a current-to-voltage converter that converts said amplified differential current into a converter voltage;

a buffer that generates said output signal in response to said converter voltage;

a first supply rail structure coupled to deliver a first supply voltage to said voltage-to-current converter and isolated from said current amplifier; and a second supply rail structure coupled to deliver a second supply voltage to said current amplifier and isolated from said voltage-to-current converter.

11. The comparator system of claim 10, wherein:

said first supply rail structure is coupled to deliver said first supply voltage to said comparator; and said second supply rail structure is coupled to deliver said second supply voltage to said current-to-voltage converter and said buffer.

12. The comparator system of claim 10, wherein said buffer is an inverter.

13. The comparator system of claim 10, wherein:

said voltage-to-current converter comprises a differential pair of first and second transistors that respectively provide first and second currents; and said current amplifier includes first and second current mirrors that respectively respond to said first and second currents.

14. The comparator system of claim 13, wherein:

said first and second current mirrors respectively terminate in first and second current-mirror transistors that are arranged as a complementary stage; and said current-to-voltage converter comprises said complementary stage.

15. The comparator system of claim 14, wherein at least one of said first and second transistors and said first and second current-mirror transistors is a metal-oxide semiconductor transistor.

16. The comparator system of claim 14, wherein at least one of said first and second transistors and said first and second current-mirror transistors is a bipolar transistor.

17. The comparator system of claim 10, wherein said current current amplifier has a gain of one.

18. The comparator system of claim 10, wherein said current current amplifier has a gain of sixteen.

19. A method of rejecting noise in the generation of an output signal whose state corresponds to the relative polarities of first and second portions of a differential input signal, comprising the steps of:

comparing said first and second portions to form an initial output signal;

converting said initial output signal to a differential current;

forming said output signal in response to said differential current;

isolating said forming step from a first supply voltage that is employed in the realization of said converting step; and isolating said converting step from a second supply voltage that is used in the realization of said forming step;

said differential current and said isolating steps enhancing noise rejection.

20. The method of claim 19, further including the step of amplifying said differential current to enhance the speed of said converting step.

21. The method of claim 20, wherein said amplifying step includes the step of mirroring said differential current.

22. The method of claim 19, further including the step of employing said first supply voltage in the realization of said comparing step.

* * * * *